United States Patent
Na

(10) Patent No.: US 8,130,493 B2
(45) Date of Patent: Mar. 6, 2012

(54) METHOD OF ARRANGING COMPONENTS OF CIRCUIT BOARD FOR OPTIMAL HEAT DISSIPATION AND CIRCUIT APPARATUS HAVING COMPONENTS ARRANGED BY PERFORMING THE METHOD

(75) Inventor: Tae-kwon Na, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 2 days.

(21) Appl. No.: 12/389,723

(22) Filed: Feb. 20, 2009

(65) Prior Publication Data

US 2009/0316357 A1  Dec. 24, 2009

(30) Foreign Application Priority Data

Jun. 20, 2008 (KR) .......................... 10-2008-58360

(51) Int. Cl.
*H05K 7/20* (2006.01)
*H05K 3/30* (2006.01)
*F28F 7/00* (2006.01)
*H01L 23/34* (2006.01)

(52) U.S. Cl. .......... 361/690; 361/777; 361/720; 29/834; 165/80.2; 165/185; 174/16.1; 257/721

(58) Field of Classification Search .................. 361/690, 361/689, 695, 697, 777; 29/834; 165/80.1–80.3, 165/185; 257/721, 722

See application file for complete search history.

(56) References Cited

U.S. PATENT DOCUMENTS

| | | | |
|---|---|---|---|
| 5,150,274 A * | 9/1992 | Okada et al. | 361/703 |
| 6,359,782 B1 * | 3/2002 | Scofield | 361/689 |
| 6,377,459 B1 * | 4/2002 | Gonsalves et al. | 361/700 |
| 6,888,725 B2 * | 5/2005 | Kubo et al. | 361/719 |
| 7,061,761 B2 * | 6/2006 | Tucker et al. | 361/695 |
| 7,623,346 B2 * | 11/2009 | Fujiya et al. | 361/694 |
| 2007/0230118 A1 * | 10/2007 | Leija et al. | 361/690 |

* cited by examiner

Primary Examiner — Zachary M Pape
(74) Attorney, Agent, or Firm — Staas & Halsey LLP

(57) ABSTRACT

A method of arranging a plurality of components of a circuit board for optimal heat dissipation and a circuit apparatus having a plurality of components arranged by performing the method are provided. The method includes arranging a predetermined number of the plurality of components in the order of size of the components in a heat dissipation area having a predetermined width on a virtual straight line connecting the air inlet unit and the air outlet unit.

20 Claims, 7 Drawing Sheets
(5 of 7 Drawing Sheet(s) Filed in Color)

METHOD OF ARRANGING COMPONENTS OF CIRCUIT BOARD FOR OPTIMAL HEAT DISSIPATION AND CIRCUIT APPARATUS HAVING COMPONENTS ARRANGED BY PERFORMING THE METHOD

CROSS-REFERENCE TO RELATED APPLICATION

This application claims the benefit of Korean Patent Application No. 2008-58360, filed Jun. 20, 2008, in the Korean Intellectual Property Office, the disclosure of which is incorporated herein by reference.

BACKGROUND OF THE INVENTION

1. Field of the Invention

Aspects of the present invention relate to an arrangement of components in an electronic circuit board, and in particular, to a method of arranging components of a circuit board for optimal heat dissipation and a circuit apparatus having components arranged by performing the method.

2. Description of the Related Art

Electronic circuits, including switched mode power supplies (SMPS), have recently become more miniaturized and integrated. In particular, components, such as power transistors that are mainly used in electronic circuits, generate much heat while operating. If such electronic circuits do not properly dissipate heat, many temperature-related problems, such as stress, may occur. Such problems also result from a failure in the arrangement of electronic components in view of heat dissipation when electronic circuits are designed.

SUMMARY OF THE INVENTION

Aspects of the present invention provide a method of arranging components of a circuit board for optimal heat dissipation, thereby obtaining an optimal heat dissipation effect by appropriately arranging electronic components in an electronic circuit that dissipates much heat, including a power circuit.

Aspects of the present invention also provide a circuit apparatus having components arranged by performing a method of arranging components of a circuit board for optimal heat dissipation.

Aspects of the present invention also provide a circuit board used in a circuit apparatus for optimal heat dissipation.

According to an aspect of the present invention, there is provided a method of arranging a plurality of components of a circuit board comprising an air inlet unit and an air outlet unit for optimal heat dissipation, the method comprising: arranging a predetermined number of the plurality of components in a head dissipation area having a predetermined width on a virtual straight line connecting the air inlet unit and the air outlet unit.

According to another aspect of the present invention, there is provided a circuit apparatus for implementing optimal heat dissipation, the circuit apparatus comprising: a circuit board on which a predetermined number of a plurality of electronic components are mounted; an air inlet unit providing a space for drawing air into the circuit board and the predetermined number of the plurality of electronic components; an air outlet unit providing a space for discharging air to the outside of the circuit board; and the predetermined number of the plurality of components arranged in the circuit board, wherein the predetermined number of the plurality of components having a size larger than a predetermined size are arranged in the order of size of the components in a heat dissipation area having a predetermined width of the circuit board in a virtual straight line connecting the air inlet unit and the air outlet unit.

According to another aspect of the present general inventive concept, there is provided a circuit board for implementing optimal heat dissipation, wherein the circuit board comprises a predetermined number of a plurality of components among which larger components having a size greater than a predetermined size are arranged in the order of size of the components in a heat dissipation area having a predetermined width in a virtual straight line connecting a point where air is taken in and a point where air is discharged.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee. These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
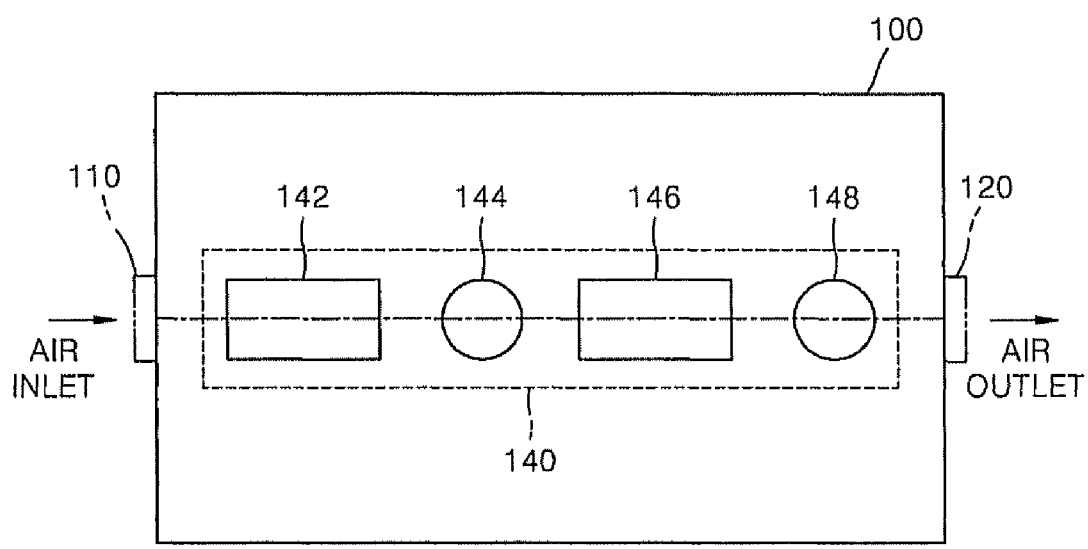
FIG. 1 is a schematic plan view of a circuit apparatus having components arranged by performing a method of arranging the components of a circuit board for optimal heat dissipation according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a schematic plan view of a circuit apparatus having components arranged by performing a method of arranging the components of a circuit board 100 for optimal heat dissipation according to an embodiment of the present invention.

Referring to FIG. 1, the circuit apparatus comprises the circuit board 100, an air inlet unit 110, an air outlet unit 120, and a plurality of components 142, 144, 146, and 148.

The circuit board 100, in which electronic components having various sizes and constituting an electronic circuit are arranged, is generally a printed circuit board (PCB).

The air inlet unit 110 is a sealed space adjoining the circuit board 100 and the components 142, 144, 146, and 148, which are mounted on the circuit board 100, so as to take in air, and has a circular or rectangular shape, however the present invention is not limited thereto. The air outlet unit 120 is a sealed space adjoining the circuit board 100 and the components 142, 144, 146, and 148, which are mounted on the circuit board 100, so as to discharge air. The air outlet unit 120 has a circular or rectangular shape, however the present invention is not limited thereto.

In the circuit apparatus of the present embodiment, the relatively larger components 142, 144, 146, and 148 are located in a heat dissipation area 140 having a predetermined width and arranged in a straight line connecting the air inlet unit 110 and the air outlet unit 120. The geometric centers of the components 142, 144, 146, and 148 arranged in the heat dissipation area 140 may be located in an area within 1.5 times the dimension of the components 142, 144, 146, and 148 from a center axis that is a virtual straight line from the air inlet unit 110 to the air outlet unit 120. For example, if the dimension of each of the components 142, 144, 146, and 148 is 20 mm, the centers of each of the components 142, 144, 146, and 148 may be located within 30 mm from the center axis. For example, the dimension of the circular component 144 is the diameter of the circular component 144, and the dimension of the rectangular component is the length of the larger side of the two sides of the rectangular components.

The number or shapes of the components 142, 144, 146, and 148 arranged in the heat dissipation area 140 are not limited by the descriptions given in the exemplary embodiments. The components 142, 144, 146, and 148 may be spaced apart from the air inlet unit 110 or the air outlet unit 120 by a distance more than the dimensions of the components 142, 144, 146, and 148. For example, if the dimensions of the components 142, 144, 146, and 148 are 10 mm, the components 142, 144, 146, and 148 may be spaced apart from the air inlet unit 110 or the air outlet unit 120 by more than 10 mm. The components 142, 144, 146, and 148 arranged in the heat dissipation area 140 are spaced apart from the air inlet unit 110 or the air outlet unit 120 by more than 5 times an inverse number of the size of the air inlet unit 110 or the air outlet unit 120. For example, if the size of the air inlet unit 110 is 2 cm, the components 142, 144, 146, and 148 may be spaced apart from the air inlet unit 110 by more than 2.5 cm, that is, 5 times ½ cm. Hereinafter, for the sake of clarity and convenience, referring to FIG. 1, a direction parallel to that of the virtual straight line connecting the air inlet unit and the air outlet unit is referred to as a first direction, and a direction vertical to the first direction is referred to as a second direction. The size of the air inlet unit or the air outlet unit is the length (second direction) of the air inlet unit or air outlet unit into which the air inlets or outlets. For example, a rectangular air inlet unit 100 having a size of 2 cm may have a length of 2 cm (second direction) of the air inlet unit 110 into which the air inlets.

If the components 142, 144, 146, and 148 arranged in the heat dissipation area 140 have rectangular cross-sections, the lengths of the components 142, 144, 146, and 148 are more than ¼ the size of the air inlet unit 110 or the air outlet unit 120 along a horizontal axis with regard to the straight line from the air inlet unit 110 to the air outlet unit 120. If the components 142, 144, 146, and 148 arranged in the heat dissipation area 140 have circular cross-sections, diameters of the components 142, 144, 146, and 148 may be more than ¼ the size of the air inlet unit 110 or the air outlet unit 120.

If the components 142, 144, 146, and 148 are heat sinks, the heat sinks may be arranged in the heat dissipation area 140 so that edge directions of the heat sinks are identical to convectional current directions thereof.

In more detail, the components 142, 144, 146, and 148 of the present embodiment are arranged according to the following two aspects discussed below.

Figure 2:
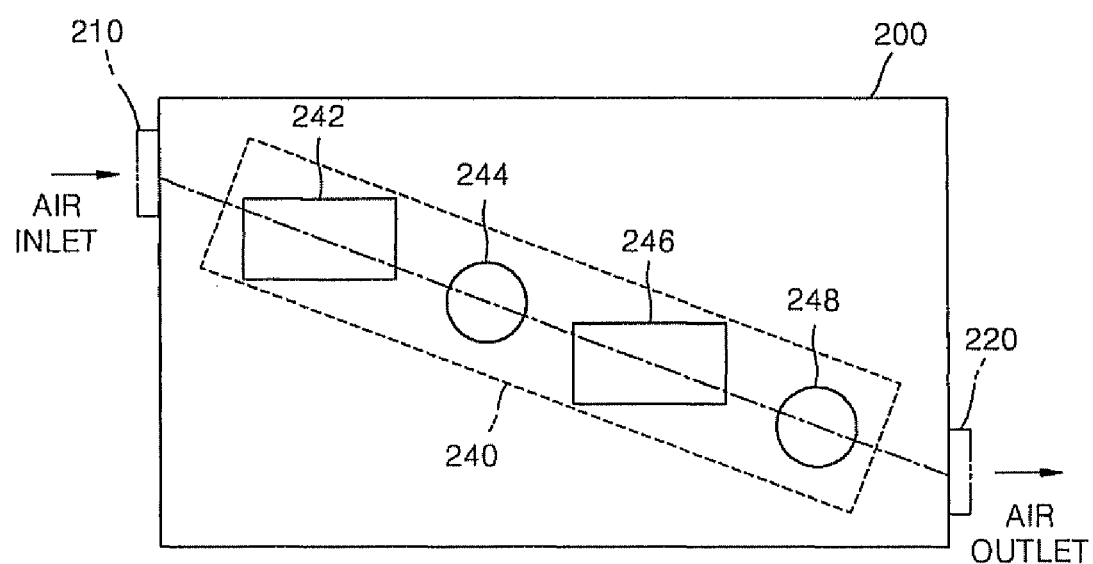
FIG. 2 is a diagram for explaining a first aspect of arranging components for optimal heat dissipation according to an embodiment of the present invention.

Referring to FIG. 2, with regard to a first aspect, components greater than a predetermined size, such as a line filter 242, a condenser 244, a transformer 246, and an output capacitor 248, are arranged in a heat dissipation area 240 of a circuit board 200 with regard to a center axis that is a virtual straight line connecting an air inlet unit 210 and an air outlet unit 220. A distance between the line filter 242, the condenser 244, the transformer 246, and the output capacitor 248 and the center axis may be within 1.5 times the size of each of the line filter 242, the condenser 244, the transformer 246, and the output capacitor 248. The centers of the line filter 242, the condenser 244, the transformer 246, and the output capacitor 248 may be located within the distance. For example, if the size of each of the line filter 242, the condenser 244, the transformer 246, and the output capacitor 248 is 20 mm, the centers of the line filter 242, the condenser 244, the transformer 246, and the output capacitor 248 may be located within 30 mm from the center axis. The components, which are the line filter 242, the condenser 244, the transformer 246, and the output capacitor 248, are arranged in the heat dissipation area 240 and are spaced apart from the air inlet unit 210 or the air outlet unit 220 by more than the size of the components. In more detail, if the size of one of the line filter 242, the condenser 244, the transformer 246, and the output capacitor 248 that is the closest to the air inlet unit 210 or the air outlet unit 220 is 10 mm, the closest one is spaced apart from the air inlet unit 210 or the air outlet unit 220 by more than 10 mm. The line filter 242, the condenser 244, the transformer 246, and the output capacitor 248 arranged in the heat dissipation area 240 may be spaced apart from the air inlet unit 210 or the air outlet unit 220 by more than 5 times an inverse number of the size of the air inlet unit 210 or the air outlet unit 220. For example, if the size of the air inlet unit 210 is 2 cm, the line filter 242, the condenser 244, the transformer 246, and the output capacitor 248 may be spaced apart from the air inlet unit 210 by more than 2.5 cm, that is, 5 times ½ cm.

In this case, convectional air currents are less influenced by each component and uniformly influence each component of the circuit apparatus. The circuit board 200 must be spaced apart from the air inlet unit 210 by more than a predetermined space so that air can be properly taken in.

Figure 3:
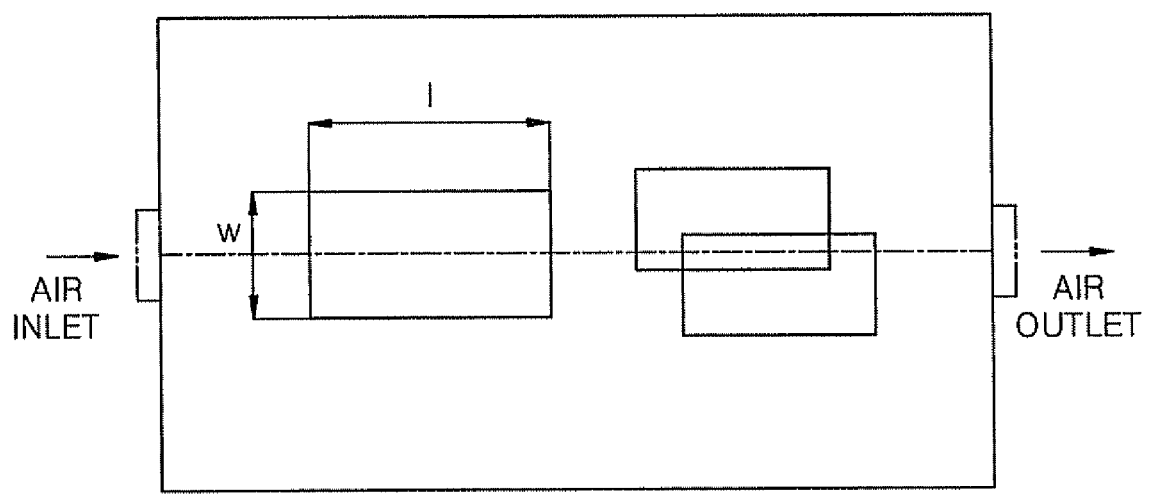
FIG. 3 is a diagram for explaining a second aspect of arranging components for optimal heat dissipation according to an embodiment of the present invention.

Referring to FIG. 3, with regard to a second condition, an electronic component having a difference between a horizontal length l and a vertical length w is arranged on a circuit board so that the shorter one of the horizontal length l and the vertical length w is arranged with regard to a convectional current direction. If the electronic component is a heat sink, the convection current direction in which air flows is arranged to be an edge direction of the heat sink. Therefore, a small amount of air resistance is applied in a direction perpendicular to the shorter length of the electronic component and the edge direction of the heat sink so that air convection efficiently takes place throughout the circuit apparatus. Air convection properly takes place owing to the first and second aspects, thereby efficiently dissipating heat of the electronic components.

Figure 4A:
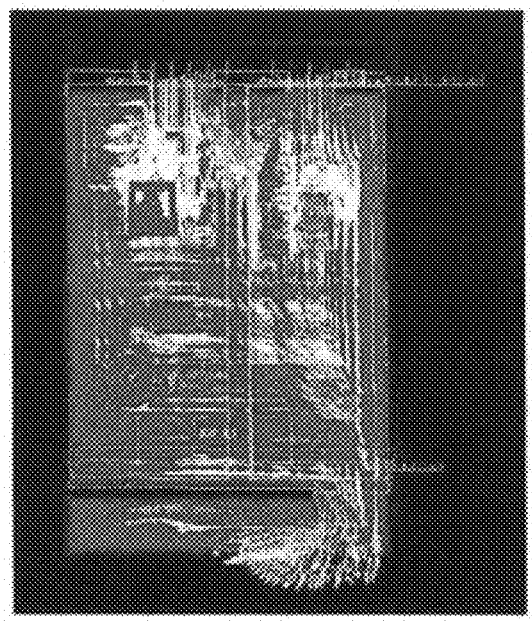
FIG. 4A is an image showing air flow before a component-arrangement method is applied to a power circuit including a plurality of electronic components according to an embodiment of the present invention.
Figure 4B:
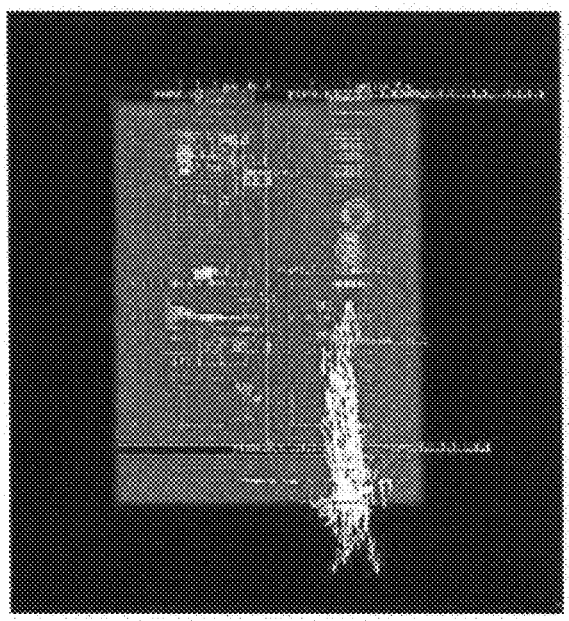
FIG. 4B is an image showing air flow after the component-arrangement method is applied to the power circuit including the plurality of electronic components according to an embodiment of the present invention.

FIG. 4A is an image showing air flow before a component-arrangement method is applied to a power circuit having a plurality of electronic components according to an embodiment of the present invention. FIG. 4B is an image showing air flow after the component-arrangement method is applied to the power circuit including the plurality of electronic components according to an embodiment of the present invention.

Figure 5:
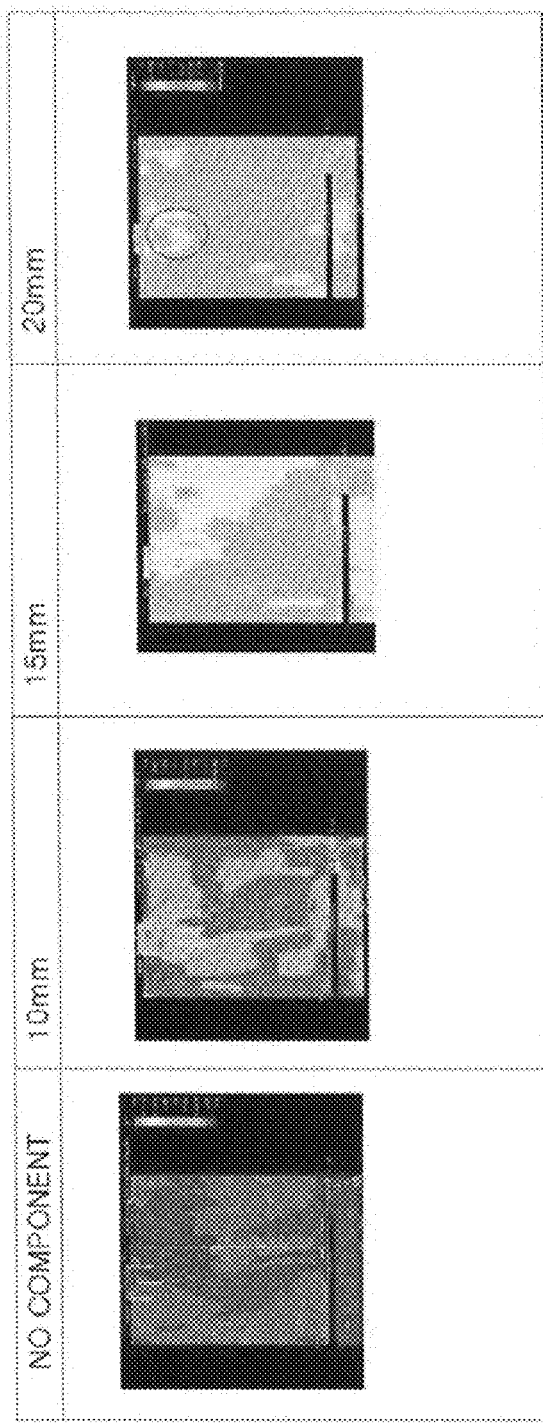
FIG. 5 is an image showing air resistance according to the size of a component having a rectangular shape according to an embodiment of the present invention.

FIG. 5 is an image showing air resistance according to the size of a component having a rectangular shape according to an embodiment of the present invention. Referring to FIG. 5, the air resistance occurs with regard to the amount of air flow around the component having the rectangular shape having a horizontal axis greater than 20 mm. Therefore, since the air resistance causes air flow to be restricted at the bottom of the component, it is necessary to arrange components having a horizontal axis greater than 15 mm.

Figure 6:
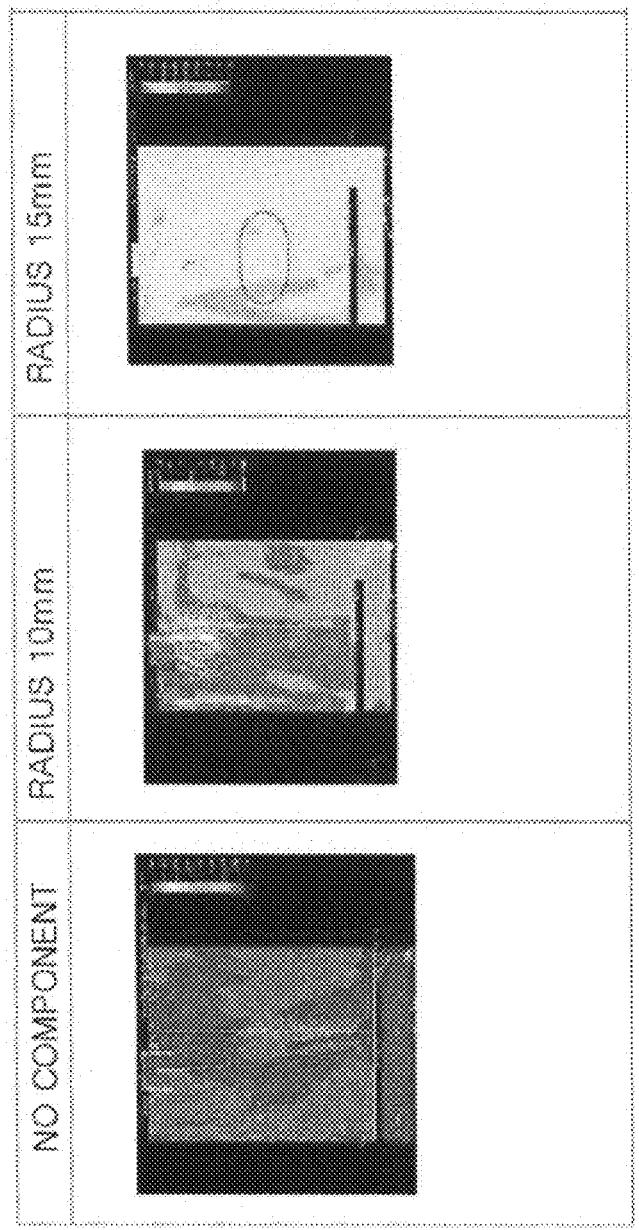
FIG. 6 is an image showing air resistance according to the size of a component having a circular shape according to an embodiment of the present invention.

FIG. 6 is an image showing air resistance according to the size of a component having a circular shape according to an embodiment of the present invention. Referring to FIG. 6, the air resistance occurs with regard to the amount of air flow around the component of the circular shape having a radius greater than 15 mm. Therefore, it is necessary to arrange components having a radius greater than 10 mm.

Figure 7:
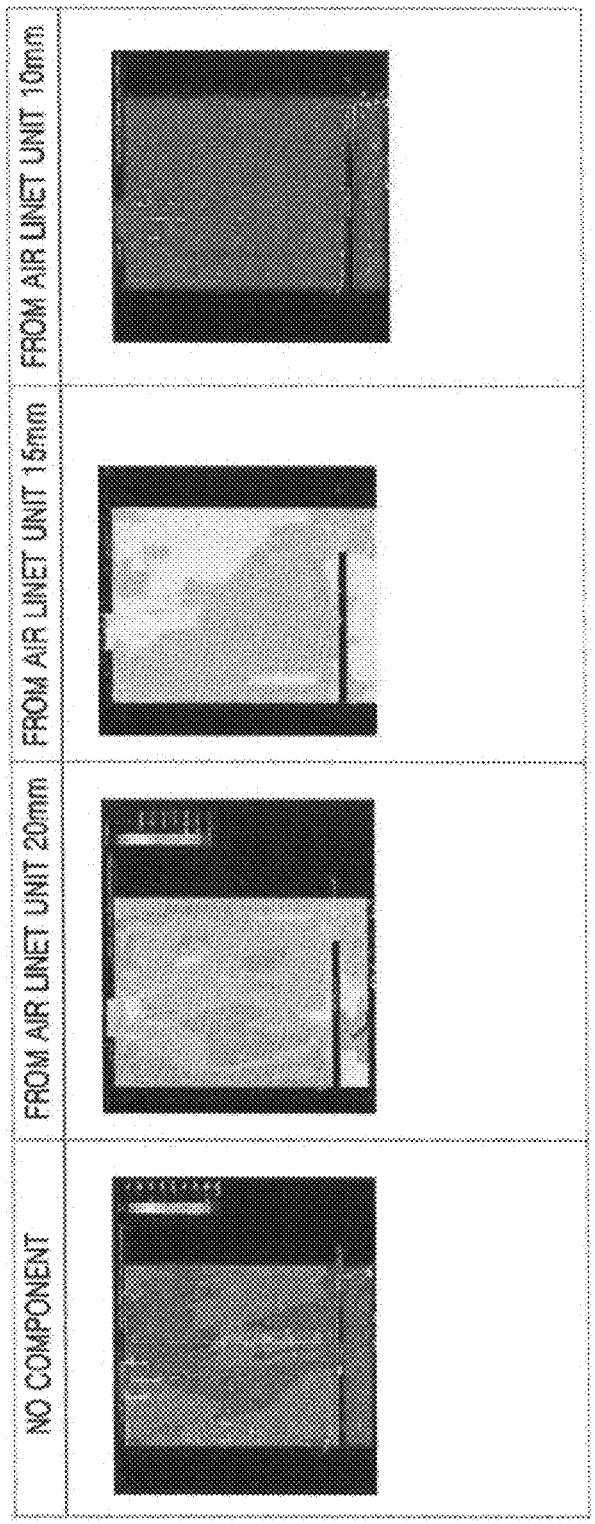
FIG. 7 is an image showing air resistance according to the distance between an air inlet unit and a component closest to the air inlet unit according to an embodiment of the present invention.

FIG. 7 is an image showing air resistance according to the distance between an air inlet unit and a component closest to the air inlet unit according to an embodiment of the present invention. Referring to FIG. 7, since the air resistance occurs when the component is spaced apart from the air inlet unit by less than 10 mm, the component needs to be spaced apart from the air inlet unit by more than 15 mm.

Figure 8:
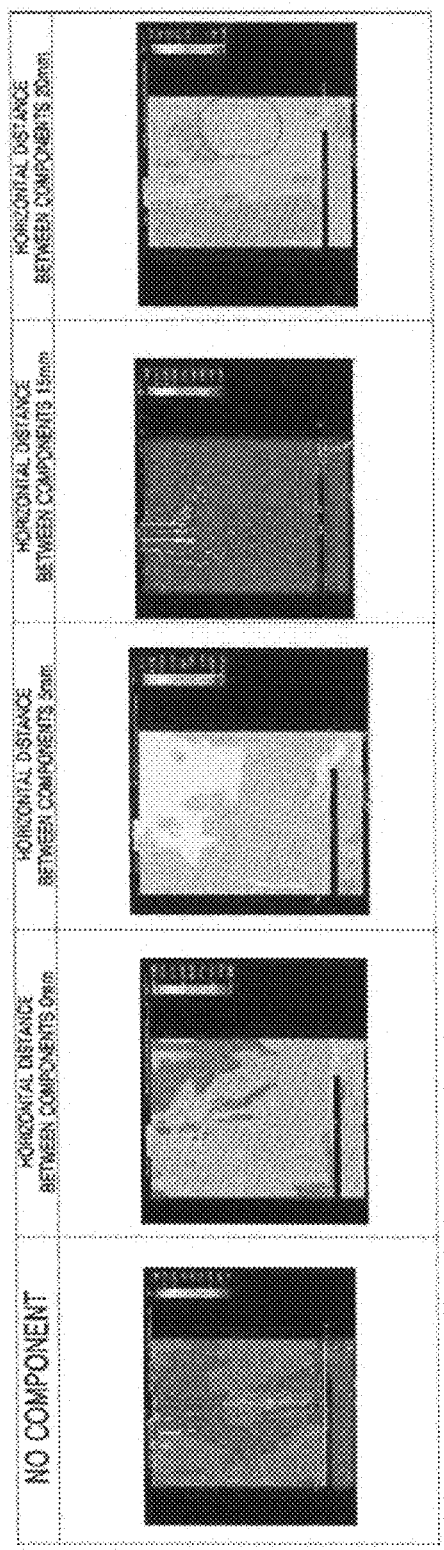
FIG. 8 is an image showing air resistance according to two or more components that are arranged in parallel to each other according to an embodiment of the present invention.

FIG. 8 is an image showing air resistance according to two or more components that are arranged in parallel to each other according to an embodiment of the present invention. Referring to FIG. 8, if the distance between the two or more components is more than 20 mm, a convection error partially occurs. Thus, it is necessary to arrange the two or more components within 15 mm from a center horizontal distance in a vertical axis of an air inlet unit and an air outlet unit.

The circuit apparatus of the present embodiment can be useful for a power circuit apparatus such as a switched mode power supply (SMPS).

A method of arranging components of a circuit board for optimal heat dissipation and a circuit apparatus having components arranged by performing the method of the present invention can efficiently dissipate heat generated by an electronic circuit, such as a power circuit, and can increase the reliability of an electronic circuit system and the lifespan of components.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of arranging a plurality of components of a circuit board having an air inlet unit and an air outlet unit for optimal heat dissipation, the method comprising:
arranging a predetermined number of the plurality of components in a heat dissipation area having a predetermined width on a virtual straight line connecting the air inlet unit and the air outlet unit,
wherein the components arranged in the heat dissipation area are relatively larger than the components located outside of the heat dissipation area on the circuit board,
wherein the plurality of components arranged in the heat dissipation area are spaced apart from the air inlet unit or the air outlet unit by more than 5 times an inverse number of a size of one of the air inlet unit or the air outlet unit, and
wherein the size of one of the air inlet unit or the air outlet unit is a length of the air inlet unit or the air outlet unit into which the air inlets or outlets, measured in centimeters.

2. The method of claim 1, wherein the plurality of components arranged in the heat dissipation area are spaced apart from each other by a gap greater than a dimension of one of the plurality of components that is the closest to the air inlet unit or the air outlet unit.

3. The method of claim 1, wherein each of the components of the plurality of components includes a center, the center of each component being arranged in the heat dissipation area so that the center is located within 1.5 times a dimension of the component in a width direction of the heat dissipation area from a center axis of the heat dissipation area.

4. The method of claim 1, wherein the plurality of components arranged in the heat dissipation area have rectangular or circular cross-sections,
wherein lengths of the plurality of components arranged in the heat dissipation area having the rectangular cross-sections are more than ¼ a size of one of the air inlet unit or the air outlet unit on a horizontal axis with regard to the virtual straight line,
wherein diameters of the plurality of components arranged in the heat dissipation area having the circular cross-sections are more than ¼ a size of one of the air inlet unit or the air outlet unit.

5. The method of claim 1, wherein the plurality of components comprise heat sinks,
wherein the heat sinks are arranged in the heat dissipation area so that an edge direction is identical to a convectional current direction.

6. A circuit apparatus, the circuit apparatus comprising:
a circuit board on which a predetermined number of a plurality of electronic components are mounted;
an air inlet unit providing a space for drawing air over the circuit board and the predetermined number of the plurality of electronic components;
an air outlet unit providing a space for discharging air to the outside of the circuit board; and
the predetermined number of the plurality of components arranged on the circuit board,
wherein the predetermined number of the plurality of components are arranged in a heat dissipation area having a predetermined width of the circuit board in a virtual straight line connecting the air inlet unit and the air outlet unit,
wherein the components arranged in the heat dissipation area are larger than the components located outside of the heat dissipation area on the circuit board,
wherein the plurality of components arranged in the heat dissipation area are spaced apart from the air inlet unit or the air outlet unit by more than 5 times an inverse number of a size of one of the air inlet unit or the air outlet unit, and wherein the size of one of the air inlet unit or the air outlet unit is a length of the air inlet unit or the air outlet unit into which the air inlets or outlets, measured in centimeters.

7. The circuit apparatus of claim 6, wherein the plurality of components arranged in the heat dissipation area are spaced apart from each other by a gap greater than a dimension of one of the plurality of components that is the closest to the air inlet unit or the air outlet unit.

8. The circuit apparatus of claim 6, wherein each of the components of the plurality of components includes a center, the center of each component being arranged in the heat dissipation area so that the center is located within 1.5 times a dimension of the component in a width direction of the heat dissipation area from a center axis of the heat dissipation area.

9. The circuit apparatus of claim 6, wherein the plurality of components arranged in the heat dissipation area have rectangular or circular cross-sections,
wherein lengths of the plurality of components arranged in the heat dissipation area having the rectangular cross-sections are more than ¼ a size of one of the air inlet unit or the air outlet unit on a horizontal axis with regard to the virtual straight line,
wherein diameters of the plurality of components arranged in the heat dissipation area having the circular cross-sections are more than ¼ a size of one of the air inlet unit or the air outlet unit.

10. The circuit apparatus of claim 6, wherein the plurality of components comprise heat sinks,
wherein the heat sinks are arranged in the heat dissipation area so that an edge direction is identical to a convectional current direction.

11. A method of forming a heat dissipation area of a circuit board having an air inlet unit and an air outlet unit, the method comprising:
determining a location of a virtual straight line between the air inlet unit and the air outlet unit; and
disposing a plurality of components having a size greater than a predetermined size along the virtual straight line to form the heat dissipation area,
wherein one of the plurality of components disposed closest to the air inlet unit or one of the plurality of components disposed closest to the air outlet unit are respectively spaced apart from the air inlet unit or the air outlet unit by more than 5 times an inverse number of the respective size of one of the air inlet unit or the air outlet unit, and
wherein the size of one of the air inlet unit or the air outlet unit is a length of the air inlet unit or the air outlet unit into which the air inlets or outlets, measured in centimeters.

12. The method of claim 11, wherein the plurality of components disposed along the virtual straight line are spaced apart from each other by a gap greater than a dimension of one of the plurality of components disposed closest to the air inlet unit or one of the plurality of components disposed closest to the air outlet unit.

13. The method of claim 11, wherein each of the components of the plurality of components includes a center, the center of each component being disposed in the heat dissipation area so that the center is located within 1.5 times the dimension of the plurality of components in a width direction of the heat dissipation area from a center axis of the heat dissipation area.

14. The method of claim 11, wherein the plurality of components arranged in the heat dissipation area have rectangular or circular cross-sections,
wherein the lengths of the plurality of components arranged in the heat dissipation area having the rectangular cross-sections are more than ¼ the size of the air inlet unit or the air outlet unit on a horizontal axis with regard to the virtual straight line,
wherein the diameters of the plurality of components arranged in the heat dissipation area having the circular cross-sections are more than ¼ the size of the air inlet unit or the air outlet unit.

15. The method of claim 11, wherein the plurality of components comprise heat sinks,
wherein the heat sinks are arranged in the heat dissipation area so that an edge direction is identical to a conventional current direction.

16. A circuit apparatus including a heat dissipation area, the circuit apparatus comprising:
a circuit board on which a plurality of electronic components are mounted;
an air inlet unit for drawing air to the circuit board;
an air outlet unit for discharging air away from the circuit board; and
the heat dissipation area formed along a virtual straight line located between the air inlet unit and the air outlet unit,
wherein the plurality of components having a size greater than a predetermined size are disposed so as to intersect the virtual straight line,
the plurality of components arranged in the heat dissipation area are spaced apart from the air inlet unit or the air outlet unit by more than 5 times an inverse number of a size of one of the air inlet unit or the air outlet unit, and
the size of one of the air inlet unit or the air outlet unit is a length of the air inlet unit or the air outlet unit into which the air inlets or outlets, measured in centimeters.

17. The circuit apparatus of claim 16, wherein the plurality of components arranged in the heat dissipation area are spaced apart from each other by a gap greater than a dimension of one of the plurality of components that is the closest to the air inlet unit or the air outlet unit.

18. The circuit apparatus of claim 16, wherein each of the components of the plurality of components includes a center, the center of each component being arranged in the heat dissipation area so that the center is located within 1.5 times a dimension of the components in a width direction of the heat dissipation area from a center axis of the heat dissipation area.

19. The circuit apparatus of claim 16, wherein the plurality of components arranged in the heat dissipation area have rectangular or circular cross-sections,
wherein lengths of the plurality of components arranged in the heat dissipation area having the rectangular cross-sections are more than ¼ a size of one of the air inlet unit or the air outlet unit on a horizontal axis with regard to the virtual straight line,
wherein diameters of the plurality of components arranged in the heat dissipation area having the circular cross-sections are more than ¼ a size of one of the air inlet unit or the air outlet unit.

20. The circuit apparatus of claim 16, wherein the plurality of components comprise heat sinks,
wherein the heat sinks are arranged in the heat dissipation area so that an edge direction is identical to a convectional current direction.

* * * * *

UNITED STATES PATENT AND TRADEMARK OFFICE
CERTIFICATE OF CORRECTION

PATENT NO. : 8,130,493 B2  
APPLICATION NO. : 12/389723  
DATED : March 6, 2012  
INVENTOR(S) : Tae-kwon Na Page 1 of 1

It is certified that error appears in the above-identified patent and that said Letters Patent is hereby corrected as shown below:

Column 7, Line 63, In Claim 13, delete "dimension of the plurality of components" and insert -- dimension of the component --, therefor.

Column 8, Line 46, In Claim 18, delete "components" and insert -- component --, therefor.

Signed and Sealed this  
Third Day of July, 2012

David J. Kappos  
*Director of the United States Patent and Trademark Office*